United States Patent
Fan et al.

(10) Patent No.: US 9,929,139 B2
(45) Date of Patent: Mar. 27, 2018

(54) MODULAR ELECTROSTATIC DISCHARGE (ESD) PROTECTION

(71) Applicant: Apple Inc., Cupertino, CA (US)

(72) Inventors: Xiaofeng Fan, Santa Clara, CA (US);
Xin Yi Zhang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 346 days.

(21) Appl. No.: 14/641,486

(22) Filed: Mar. 9, 2015

(65) Prior Publication Data
US 2016/0268248 A1   Sep. 15, 2016

(51) Int. Cl.
*H01L 27/02* (2006.01)
*H01L 23/60* (2006.01)
*H01L 23/552* (2006.01)

(52) U.S. Cl.
CPC ........ *H01L 27/0255* (2013.01); *H01L 23/552* (2013.01); *H01L 23/60* (2013.01); *H01L 27/0288* (2013.01); *H01L 27/0292* (2013.01)

(58) Field of Classification Search
CPC ............. H01L 27/0255; H01L 27/0292; H01L 23/552; H01L 27/0288; H01L 23/60
See application file for complete search history.

(56) References Cited

U.S. PATENT DOCUMENTS

| | | | |
|---|---|---|---|
| 6,075,686 A * | 6/2000 | Ker | H01L 27/0251 361/56 |
| 6,266,222 B1 | 7/2001 | Colombo | |
| 7,898,056 B1 * | 3/2011 | Keramat | H01L 23/564 257/170 |
| 2011/0205673 A1 * | 8/2011 | Okushima | H03K 19/003 361/56 |
| 2013/0050887 A1 * | 2/2013 | Fan | H01L 27/0617 361/57 |
| 2013/0114171 A1 | 5/2013 | Haralabidis | |
| 2014/0268444 A1 * | 9/2014 | Bertin | H01L 27/0266 361/56 |

* cited by examiner

*Primary Examiner* — Zeev V Kitov
(74) *Attorney, Agent, or Firm* — Meyetons, Hood, Kivlin, Kowert & Goetzel, P.C.; Lawrence J. Merkel

(57) ABSTRACT

In an embodiment, an integrated circuit (IC) may include a circuit block that couples to one or more pins of the IC to communicate and/or receive power on the pins. The circuit block may include a ground connection, which may be electrically insulated/electrically separate from the ground connection of other components of the integrated circuit. In an embodiment, the circuit block may include an ESD protection circuit for the pad coupled to the pin. The IC may include another ESD protection circuit for the pad. The circuit block's ESD protection circuit may be sized for the current that may produced within the circuit block for an ESD event, and the IC's ESD protection circuit may be sized for the current that may be produced from the other components of the IC.

20 Claims, 5 Drawing Sheets

MODULAR ELECTROSTATIC DISCHARGE (ESD) PROTECTION

BACKGROUND

Technical Field

Embodiments described herein are related to electrostatic discharge (ESD) protection in integrated circuits.

Description of the Related Art

The transistors and other circuits fabricated in semiconductor substrates are continually being reduced in size as semiconductor fabrication technology advances. Such circuits are also increasingly susceptible to damage from ESD events, thus increasing the importance of the ESD protection implemented in integrated circuits. Generally, ESD events occur due to the accumulation of static charge, either on the integrated circuits themselves or on devices or other things that come into contact with the integrated circuits. Entities such as humans can also accumulate static charge and cause ESD events when coming into contact with an integrated circuit or its package.

A sudden discharge of the static charge can cause high currents and voltages that can damage the integrated circuit, and the potential for damage is higher with smaller feature sizes. There are various models for ESD events, which integrated circuit designers use to design and evaluate ESD protection circuits. For example, the charged device model (CDM) models the discharge of static electricity accumulated on the integrated circuit itself. The human body model (HBM) models the discharge of static electricity from a human body touch on the integrated circuit. Other models may be used for other types of ESD (e.g. the contact of various machines during manufacturing, etc.).

Typical ESD protection circuits for integrated circuits include diodes that are connected between integrated circuit input/output signal pin connections and power/ground connections. The diodes and other protection circuits are designed to turn on if an ESD event occurs, rapidly discharging the ESD event to avoid damage to the functional circuits (e.g. driver/receiver transistors) that are coupled to the pin connections. The ESD circuits are designed to withstand the maximum currents/voltages of various ESD events, according to a specification to which the integrated circuit is designed.

When a load-sensitive circuit (e.g. a high speed analog circuit) is integrated into a larger integrated circuit, the size of the ESD devices presents significant design challenges. The large ESD devices load the pins, reducing performance of the high speed circuit. The large ESD devices also consume significant area. Furthermore, the need to size the devices based on the size of the complete integrated circuit and/or its packaging (e.g. for CDM ESD protection) makes the reuse of the circuit in different integrated circuit designs problematic.

SUMMARY

In an embodiment, an integrated circuit (IC) may include a circuit block that couples to one or more pins of the IC (when packaged) to communicate and/or receive power on the pins. The circuit block may include a ground connection, which may be electrically insulated/electrically separate from the ground connection of other components of the integrated circuit. In an embodiment, the circuit block may include an ESD protection circuit for the pad coupled to the pin. The IC may include another ESD protection circuit for the pad. The circuit block's ESD protection circuit may be sized for the current that may produced within the circuit block for an ESD event, and the IC's ESD protection circuit may be sized for the current that may be produced from the other components of the IC. In an embodiment, reuse of the circuit block in other IC designs may be simplified, since the circuit block's ESD protection need not change. Each IC may provide appropriate ESD protection based on the IC's components, characteristics, and specifications. Alternatively, ESD protection for the largest IC in which the circuit block may be instantiated may be provided in the IC's ESD protection circuit. In an embodiment, the combination of the circuit block's ESD protection circuit and the IC's ESD protection circuit may present less load on the pin, from the perspective of the circuit block, than traditional ESD protection and thus performance may be less impacted while providing robust ESD protection.

BRIEF DESCRIPTION OF THE DRAWINGS

The following detailed description makes reference to the accompanying drawings, which are now briefly described.

Figure 1:
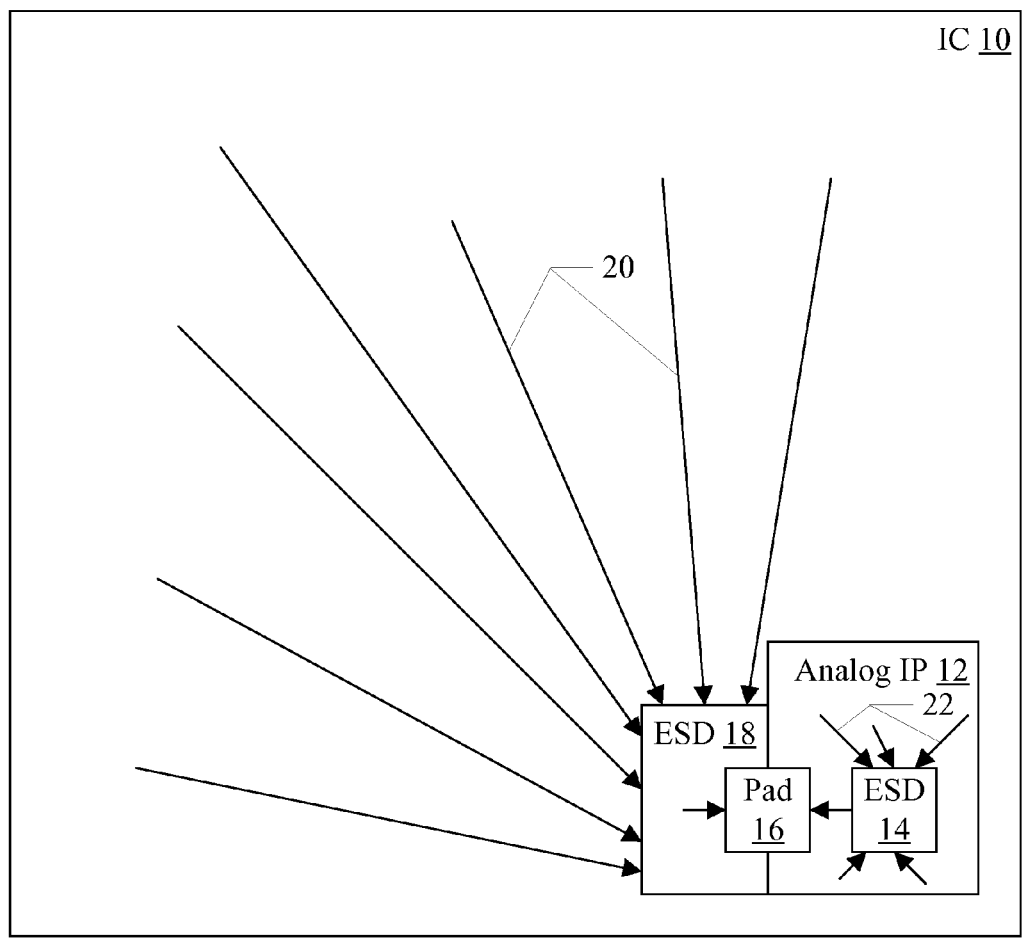
FIG. 1 is a block diagram of one embodiment of an integrated circuit including an intellectual property (IP) circuit and ESD protection circuitry within the IP circuit and external to the IP circuit.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) interpretation for that unit/circuit/component.

This specification includes references to "one embodiment" or "an embodiment." The appearances of the phrases "in one embodiment" or "in an embodiment" do not necessarily refer to the same embodiment, although embodiments that include any combination of the features are generally contemplated, unless expressly disclaimed herein. Particular features, structures, or characteristics may be combined in any suitable manner consistent with this disclosure.

DETAILED DESCRIPTION OF EMBODIMENTS

Turning now to FIG. 1, a block diagram of one embodiment of an IC 10 is shown. In the illustrated embodiment, the IC 10 includes an analog intellectual property (IP) block 12 (which includes an ESD protection circuit 14) coupled to a pad 16 which is further coupled to an ESD protection circuit 18.

The CDM ESD event may be the most challenging of the ESD events to manage in an environment such as that shown in FIG. 1, where a relative small IP block 12 is instantiated in a larger IC design. Accordingly, CDM ESD protection is used as an example in the description below, however, ESD protection from any ESD event may be accomplished using the ESD protection circuitry and scheme described below.

In a CDM ESD event, the static charge present on the IC may be reasonably well distributed over the surface of the IC and/or its package. Thus, the CDM event may be a function of the size of the IC and/or its package, among other things. That is, the larger the IC/package, the greater the accumulation of static charge. A static charge may be accumulated over the IC 10, and then discharged through the pin coupled to the pad 16, in a CDM ESD event. The current that occurs in the remainder of the IC 10 during a CDM ESD event (represented by the arrows 20 in FIG. 1) may be significantly higher than the current in the analog IP block 12 (arrows 22 in FIG. 1). Accordingly, the ESD protection circuit 18 may be designed to discharge the current from the rest of the IC 10 through the pad 16 and its associated pin. The ESD protection circuit 14, on the other hand, may be designed to handle the current from the CDM ESD event within the analog IP block 12.

An analog IP block 12 is used as an example herein of a circuit block that may have a high speed, load sensitive pin or pins to communicate external to the IC 10. For example, the pin may be an input or an output for the IC to connect to an analog circuit in a system that includes the IC 10. Because analog signals are continuous time, continuous value signals, the load on the signals can change the nature of the signal communicated (e.g. introducing noise). Accordingly, controlling the load may be of high importance. Other embodiments may be implemented in an IP block or other circuit block that is digital.

Generally, a circuit block may be a self-contained circuit having a well defined and documented interface and a well defined function that is implemented by the circuit block. Other components of an integrated circuit may be designed separately, and may use the interface definition to interface to the circuit block. Accordingly, the circuit block may be instantiated in a given IC design and, presuming that other components have correctly implemented the interface to the circuit block, the overall IC may be expected to work correctly merely by instantiating the block and connecting the interface. An IP block may be a circuit block that is designed by a third party and offered for sale in a form that permits its instantiation in an IC design. IP blocks may be soft (e.g. synthesizable and integrated into the design as part of the synthesis) or hard (e.g. already implemented in a given technology and instantiated at the place and route stage or later state in the design of the IC).

While not explicitly shown in FIG. 1, the IC 10 may include various other components, which may include circuit blocks that communicate with the analog IP block 12, other circuit blocks, and/or other circuitry external to the IC 10 over one or more pins of the IC 10. In an embodiment, the IC 10 may be a system on a chip (SOC) that includes one or more processors as well as various other components (e.g. a memory controller to communicate with memory, peripheral interface controllers to control various peripheral interfaces, on-chip peripherals, etc.). Other ICs may include any other desired components.

The pad 16 may be instantiated on the semiconductor substrate to provide a connection point for the package into which the IC 10 will be inserted, ultimately to be connected to a pin on the package. The pad 16 may be formed of conductive material and may be sized to permit the package assembly based on the package requirements, etc. The pad 16 may thus be a controlled-collapse chip connection (C4) bump for flip chip connection, for example. In another embodiment, the pad may be a generally square or rectangular conductive surface to which a wire bond may be attached. Any type of pad for providing connection to the package may be used. Generally, the IC 10 may be any semiconductor substrate on which circuitry has been constructed using a set of process steps. For example, silicon may be used. In an embodiment, a silicon FinFET (Field Effect Transistor) technology may be used.

Figure 2:
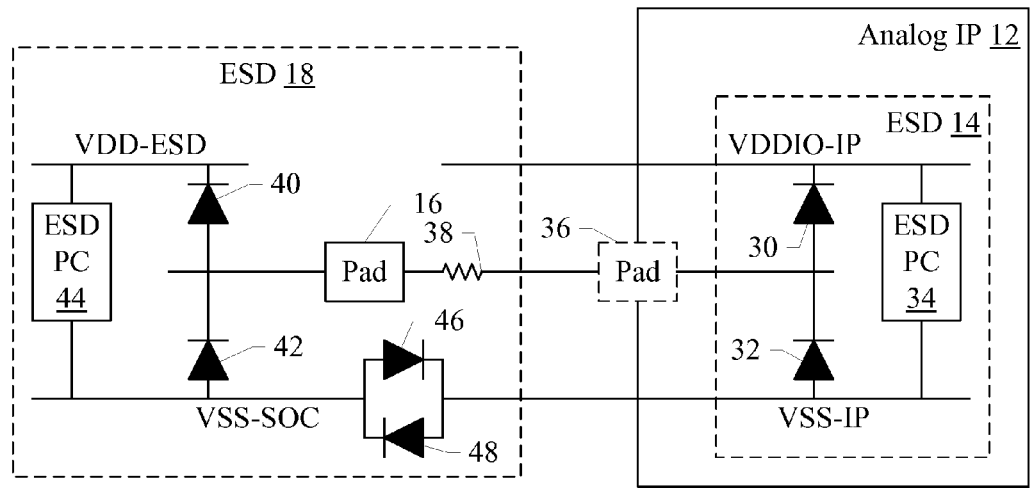
FIG. 2 is a circuit diagram of one embodiment of ESD protection circuitry within the IP circuit and external to the IP circuit.

FIG. 2 is a circuit diagram illustrating one embodiment of the ESD protection circuit 14 and the ESD protection circuit 18 in greater detail. In the illustrated embodiment, the ESD protection circuit 14 includes a diode 30 coupled between a power supply conductor (VDDIO-IP) that corresponds to the pad 16 and a conductor that leads to a virtual pad 36, a diode 32 coupled to the conductor that leads to the virtual pad 36 and coupled to a ground conductor for a ground (VSS-IP). Both the VDDIO-IP conductor and the VSS-IP conductor may be coupled to one or more pads to connect to power supply and ground connections on the package of the IC 10. The ESD circuit 14 further includes an ESD power clamp (PC) circuit 34 coupled between the VDDIO-IP and VSS-IP conductors. The ESD PC circuit 34 may be configured to ensure that the voltage across the VDDIO-IP and VSS-IP supplies does not exceed a predefined "safe" level during an ESD event. Viewed in another way, the ESD PC circuit 34 may be coupled in parallel with the diodes 30 and 32.

The pad 36 may be a virtual pad because the pad that actually connects to the package pin for the signal may be the pad 16. A resistor 38 is included between the pad 36 and the pad 16 as part of the ESD protection circuit 18. The resistor 38 may limit ESD current in the ESD protection circuit 18 into the analog IP block 12 during an ESD event. Accordingly, the sizing/current capabilities of the devices in the ESD protection circuit 14 (e.g. the diodes 30-32 and the ESD PC circuit 34) may be based on the currents that may be sourced within the analog IP circuit 12. Relatively small devices, which present a relatively small load on the conductor to the pad 36, may be used. In contrast, if the diodes 30-32 were designed to sink the entire ESD current for the IC 10 and without an excessive voltage across the transistors for the driver and/or receiver in the analog IP block 12, the diodes would be much larger.

The ESD protection circuit 18 similarly includes diodes 40 and 42 coupled between the pad 16 and a VDD-ESD conductor and a VSS-SOC conductor, respectively. In parallel with the diodes 40 and 42 between the VDD-ESD conductor and the VSS-SOC conductor is an ESD PC circuit 44 similar to the ESD PC circuit 34. The diodes 40-42 and the ESD PC circuit 44 may be sized for the ESD currents that may occur from the rest of the IC 10 to the pad 16. However, because these devices do not directly load the Analog IP block 12, they need not be as large as they would otherwise be to protect the circuitry within the analog IP block 12. The combination of the diodes 30-32 and 40-42 may be smaller than the diodes 30-32 would be in the absence of the ESD protection circuit 18. In a conventional ESD protection scheme, for example, the ESD diodes 30 and 32 inside the IP block 12 are the sole current path for ESD events. In the conventional scheme, their size is determined not only by the ESD current scale but also by the ESD sensitivity of the other circuits connected to the pad 36. Thus, the diodes 30 and 32 were often large in area and capacitance load, in order to provide low impedance.

In the various ESD protection schemes disclosed in embodiments herein, the diodes 40 and 42 in the ESD protection circuit 18 may conduct the majority of the discharge current from the IC 10 for an ESD event. The diodes 40 and 42 may have a relatively large impedance, because the voltage drop between the pad 16 and VSS-SOC during ESD events is distributed over cross-coupled diodes set 46-48, the ESD diodes 30 and 32 and the pad resistor 38. Therefore, the voltage delta between the pad 36 and VSS-IP may be controlled within a safe window for circuits coupled to the pad 36. Due to the loose impedance requirement of the scheme, the diodes 40 and 42 and the diodes 30 and 32 may be fabricated in a smaller area and with a smaller capacitance load than the single diodes of the conventional scheme, in some embodiments.

Including the ESD protection circuit 18 may improve the ability to reuse the analog IP block 12 in other integrated circuit designs, because changes that occur due to differing sizes in the integrated circuits, etc., may be managed in the design of the ESD protection circuit 18.

Figure 7:
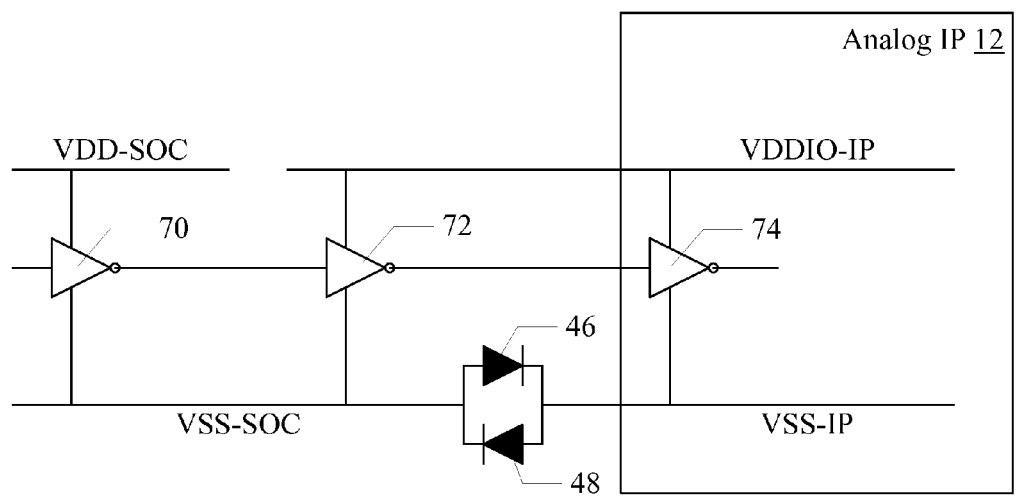
FIG. 7 is a circuit diagram of one embodiment of interface circuitry between the IP block and other parts of the integrated circuit.
Figure 8:
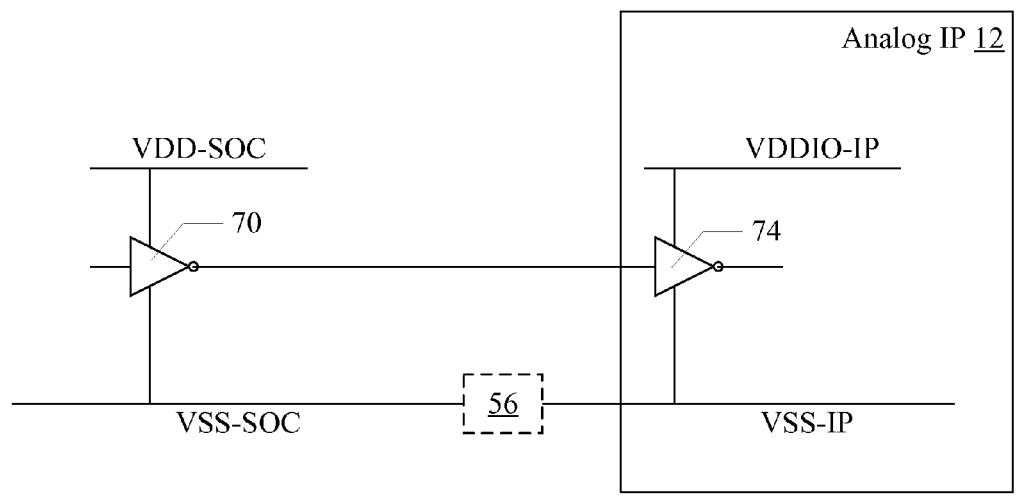
FIG. 8 is a circuit diagram of another embodiment of interface circuitry between the IP block and other parts of the integrated circuit.

The VDD-ESD conductor may or may not be powered with a supply voltage. More particularly, the functional circuitry in the IC 10 (the circuitry implementing the desired operation of the IC 10) may be coupled to a different supply conductor than the VDD-ESD (e.g. it may be VDD-SOC, as illustrated in FIGS. 7 and 8). VDD-ESD may be provided as a current path from the diode 40 through the ESD PC circuit 44 to the ground. In some embodiments, VDD-ESD and the ESD PC circuit 44 may be shared among multiple diodes 40 coupled to multiple pads 16. The VDD-ESD, in some embodiments, may be a supply voltage (e.g. VDD-SOC or a different supply voltage). However, the VDD-ESD may be separate from the VDDIO-IP for this embodiment.

If the VDD-ESD is powered to a power supply voltage, the VDD-ESD conductor may be coupled to one or more pads as mentioned above for VDDIO-IP. The ground VSS-SOC may also be coupled to one or more pads to couple to one or more pins.

The two grounds (VSS-SOC and VSS-IP) may be electrically separate, decoupling the analog IP block 12 from the rest of the IC 10. In this embodiment, current may not flow between the two grounds unless the voltage difference between the grounds exceeds the threshold voltage of one of the diodes 46-48. During normal operation, the grounds should not have such a voltage difference. Generally, diodes may be "cross-coupled" if each diode's anode is connected to the other diode's cathode.

The above discussion states the VDDIO-IP may be the power supply voltage that corresponds to the pad 16. That is, the VDDIO-IP may be the power supply voltage that powers interface circuitry within the analog IP block 12 that communicates on the pad 16. The interface circuitry may include a receiver that drives a logical one on its output that is equal to the VDDIO-IP voltage. The interface circuitry may include a driver that drives a logical high at the VDDIO-IP voltage. The interface circuitry may be referred to as biased by the VDDIO-IP voltage or referenced to the VDDIO-IP voltage.

Figure 3:
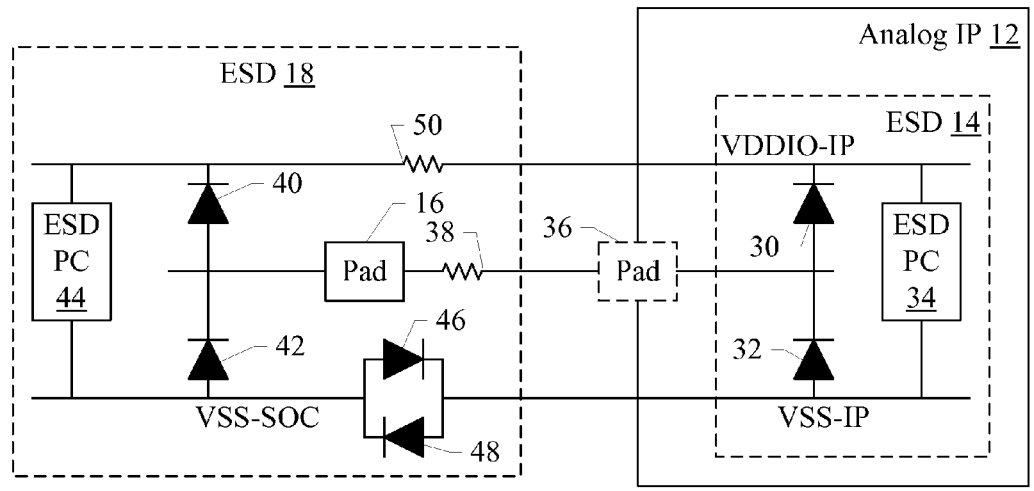
FIG. 3 is a circuit diagram of a second embodiment of ESD protection circuitry within the IP circuit and external to the IP circuit.

FIG. 3 is another embodiment of the ESD protection circuit 18. The ESD protection circuit 14 may be similar to the ESD protection circuit 14 described above for the embodiment of FIG. 2. The ESD protection circuit 18 also includes the diodes 40 and 42 and the ESD PC circuit 44. However, in this embodiment, the ESD-VDD connection for the diode 40 and the ESD PC circuit 44 is replaced by a connection to the VDDIO-IP supply voltage. A resistor 50 is inserted, however, to limit current to the analog IP block 12 during an ESD event.

Figure 4:
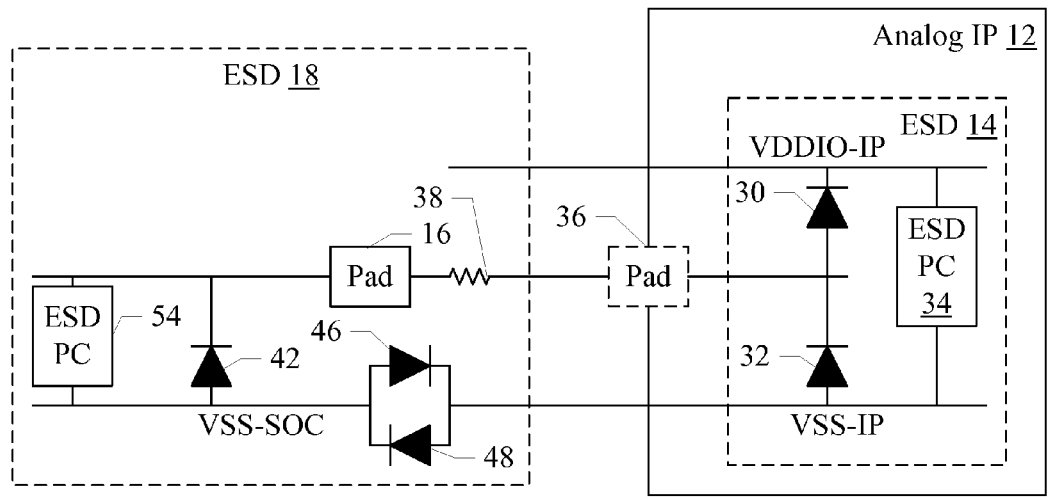
FIG. 4 is a circuit diagram of a third embodiment of ESD protection circuitry within the IP circuit and external to the IP circuit.

FIG. 4 is a third embodiment of the ESD protection circuit 18. The ESD protection circuit 14 may be similar to the ESD protection circuit 14 described above for the embodiment of FIG. 2. In another embodiment, the ESD protection circuit 14 may be similar to the ESD protection circuit 18 as illustrated in FIG. 4 (except coupled to the VSS-IO ground). The ESD protection circuit 18 also includes the diode 42, but not the diode 40. An ESD PC circuit 54 is coupled between the pad 16 and the VSS-SOC ground. In this embodiment, the ESD events from the IC 10 side are discharged through the ESD PC circuit 54 or the diode 42.

Figure 5:
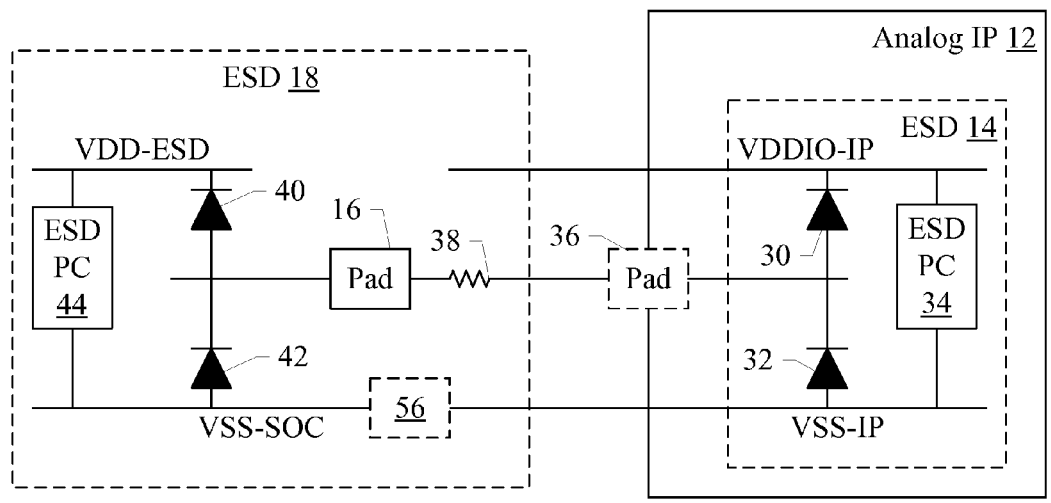
FIG. 5 is a circuit diagram of a fourth embodiment of ESD protection circuitry within the IP circuit and external to the IP circuit.

The embodiments of FIGS. 2-4 use the cross-coupled diodes 46 and 48 between the two grounds. Other embodiments may provide the separation in other fashions. For example, the embodiment of FIG. 5 is similar to the embodiment of FIG. 2 but does not include the cross-coupled diodes 46 and 48. Instead, on the IC 10 itself, the two grounds may be unconnected (illustrated by the dotted box 56). Embodiments similar to FIGS. 3 and 4 but having unconnected grounds as shown in FIG. 5 are contemplated as well.

Figure 6:
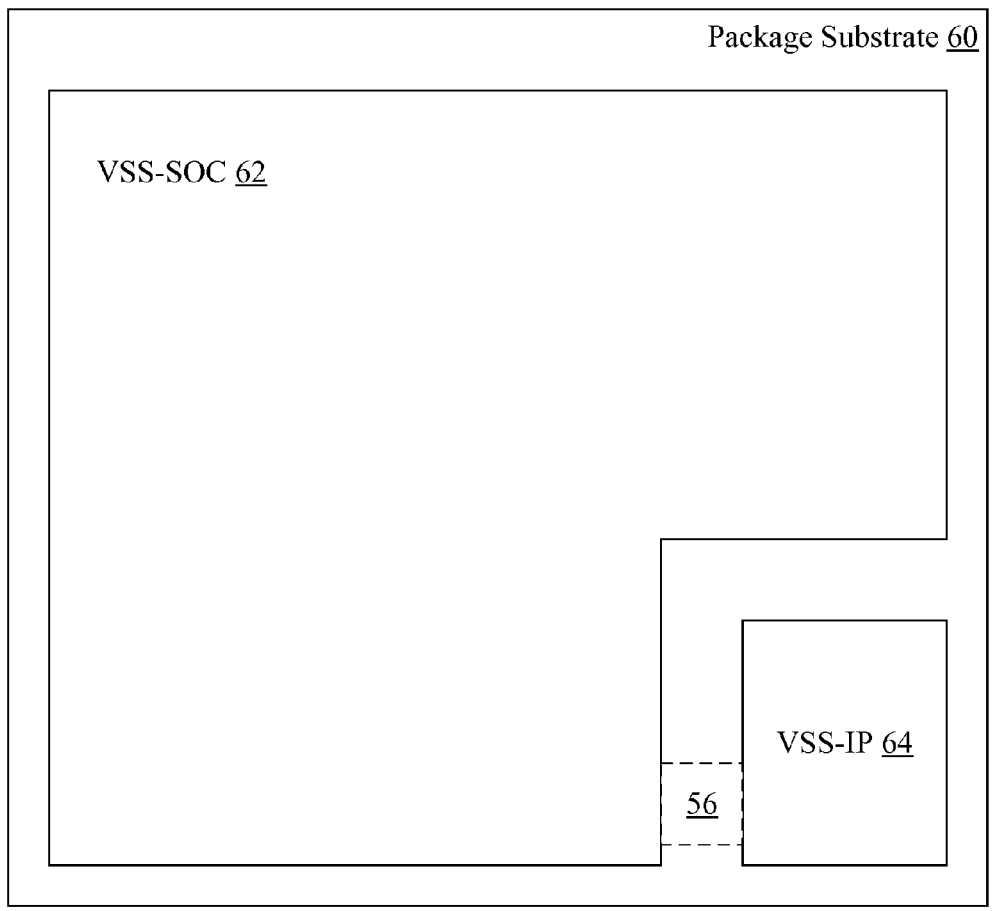
FIG. 6 is a block diagram of one embodiment of a package substrate that may be used with the integrated circuit.

The grounds may instead be coupled at the package level. For example, FIG. 6 illustrates a package substrate 60 that may be part of one embodiment of a package for the IC 10. The package substrate 60 may be used to couple the IC 10 (e.g. the C4 bumps, in an embodiment) to the pins of the package (e.g. solder balls in a ball grid array package, pins in a pin grid array package or various peripheral pin packages, etc.). The package substrate 60 may include a VSS-SOC plane 62 to connect to the VSS-SOC pads throughout the IC 10, and may include a VSS-IP plane 64. By selecting the location of the connection 56 (also referred to as a VSS bridge) between the two planes, the ESD current may be directed to travel in a particular direction out of the VSS-IP plane.

It is noted that, while the embodiments of FIGS. 2-5 illustrate various ESD protection circuits for one pad/pin from the analog IP block 12, in general multiple pads/pins may be supported from a block. Similar circuitry to that shown in the various embodiments may be used. In some cases, a component or components of the embodiments may be shared. For example, as mentioned previously, the ESD PC circuits 34, 44, and/or 54 may be shared by multiple pads/pins.

When separating the grounds on the IC 10 (e.g. with the cross-coupled diodes 46-48), cross-domain CDM ESD events may occur through the circuits that interface between the analog IP block 12 and the other components of the IC 10. For example, ESD current could flow from VSS-SOC through the P-type metal-oxide-semiconductor (PMOS) transistors of interface circuitry in the IC 10 component to the node that crosses into the analog IP block 12, and through the N-type MOS (NMOS) transistors of the circuitry in the analog IP block 12 to the VSS-IP ground. This current flow may be undesirable and could be damaging.

FIG. 7 is a circuit diagram illustrating one embodiment of a circuit that may reduce the cross-domain CDM ESD events. In the illustrated embodiment, three inverters 70, 72, and 74 are shown. The inverter 70 is powered by VDD-SOC and is coupled to the VSS-SOC ground. Thus, the inverter 70 is part of the SOC domain. The inverter 72 is powered by the VSSIO-IP power supply but is also coupled to the VSS-SOC ground. Thus, the inverter 72 effectively straddles the domains. The connection of the inverter 72 to the VSS-SOC ground may shield the analog IP block 12 from external ESD events. The ESD protection circuit 18 may thus handle the ESD event as expected. The inverter 74 is coupled between the VDDIO-IP and VSS-IP, and thus is a normal circuit in the analog IP block 12.

While FIG. 7 illustrates a series of inverters 70, 72, and 74 (i.e. the output of the inverter 72 is the input of the inverter 72, and output of the inverter 72 is the input of the inverter 74), other embodiments may use any circuitry such as other logic gates or other circuits such as level shifters or analog to digital converters and digital to analog converters. In general, the circuitry may include a circuit powered by the VDDIO-IP power supply and coupled to the VSS-SOC ground in between outputs from the components of IC 10 and inputs to the analog IP block 12.

Embodiments which couple the VSS-SOC and VSS-IP grounds together at the package level may alleviate the cross-domain issue. Accordingly, interface circuitry between the components of the IC 10 and the analog IP block 12 need not include cross-domain circuitry such as the inverter 72 in FIG. 7. FIG. 8 illustrates such a circuit, including the inverter 70 and the inverter 74 but omitting the inverter 72.

Numerous variations and modifications will become apparent to those skilled in the art once the above disclosure is fully appreciated. It is intended that the following claims be interpreted to embrace all such variations and modifications.

What is claimed is:

1. An integrated circuit (IC) comprising:
    a first pad to connect to a first pin of a package of the IC;
    a first ground conductor for connection to a first ground of the IC;
    a second ground conductor for connection to a second ground of the IC, wherein the first ground and the second ground are electrically separated on the IC;
    a circuit block within the IC that is configured to communicate external to the IC on the first pin, wherein the circuit block is coupled to the first ground, wherein the circuit block includes a first electrostatic discharge (ESD) protection circuit coupled between the first pad and the first ground, wherein the first ESD protection circuit is configured to provide ESD protection within the circuit block for a charged device model (CDM) ESD event occurring through the first pin, wherein the CDM ESD event discharges static charge distributed over the IC through the first pin, and wherein the first ESD protection circuit is configured to discharge the static charge from a first area of the IC that is covered by the first circuit block; and
    a second ESD protection circuit coupled between the first pad and the second ground, wherein the second ESD protection circuit is configured to provide ESD protection for a remainder of the IC for the CDM ESD event occurring through the first pin, wherein the second ESD protection circuit is configured to discharge the static charge from a second area of the IC that is covered by the remainder of the IC.

2. The IC as recited in claim 1 wherein the second ESD protection circuit comprises a first diode connected between the first pad and the second ground conductor.

3. The IC as recited in claim 2 wherein the second ESD protection circuit further comprises a second diode connected between the first pad and a conductor; and a clamp circuit coupled between the conductor and the second ground conductor.

4. The IC as recited in claim 3 wherein the conductor is coupled to a supply voltage used by the circuit block.

5. The IC as recited in claim 2 wherein the second ESD protection circuit further comprises a clamp circuit coupled in parallel with the first diode.

6. The IC as recited in claim 1 wherein the first ESD protection circuit further comprises a first diode coupled between a first resistor and the first ground conductor.

7. The IC as recited in claim 6 wherein the first ESD protection circuit further comprises a second diode coupled between the first resistor and a power supply conductor that is powered to a power supply voltage corresponding to the first pin during use.

8. The IC as recited in claim 1 further comprising cross-coupled diodes connected between the first ground conductor and the second ground conductor.

9. The IC as recited in claim 8 wherein an interface between the circuit block and a second circuit in the IC includes at least one circuit powered by a supply voltage within the circuit block and grounded by the second ground.

10. The IC as recited in claim 1 further comprising connecting the first ground and the second ground in a package for the IC.

11. The IC as recited in claim 1 wherein the second ESD protection circuit includes a first resistor connected in series between the first pad and the first ESD protection circuit.

12. An apparatus comprising:
    an integrated circuit (IC) including:
        a circuit block that is configured to communicate external to the IC on a first pin, wherein the circuit block is coupled to a first ground and includes a first electrostatic discharge (ESD) protection circuit coupled between the first pin and the first ground, wherein the first ESD protection circuit is sized to provide ESD protection within the circuit block for a charged device model (CDM) ESD event occurring through the first pin, wherein the CDM ESD event discharges static charge distributed over the IC through the first pin, and wherein the first ESD protection circuit is configured to discharge the static charge from a first area of the IC that is covered by the first circuit block;

a second ESD protection circuit coupled between the first pin and a second ground, wherein the second ESD protection circuit is configured to provide ESD protection for a remainder of the IC for the CDM ESD event occurring through the first pin, wherein the second ESD protection circuit is configured to discharge the static charge from a second area of the IC that is covered by the remainder of the IC;

wherein the first ground and the second ground are unconnected on the IC; and a package for the integrated circuit, wherein the package couples the integrated circuit to the first pin, and wherein the package couples the first ground to the second ground with a connection that directs ESD current out of the circuit block in a specific direction based on a location of the connection with the circuit block.

13. The apparatus as recited in claim 12 wherein the first ground and the second ground are electrically insulated on the integrated circuit.

14. The apparatus as recited in claim 13 wherein the first ground and the second ground are unconnected on the integrated circuit.

15. The apparatus as recited in claim 12 wherein the second ESD protection circuit comprises a series resistor between the first pad and the first ESD protection circuit.

16. The apparatus as recited in claim 12 wherein the first ESD protection circuit comprises:

a first diode coupled between a resistor and the first ground;

a second diode coupled between the resistor and a power supply in the circuit block; and a clamp circuit coupled between the power supply and the first ground.

17. The apparatus as recited in claim 16 wherein the second ESD protection circuit comprises a third diode coupled between the first pad and the second ground.

18. The apparatus as recited in claim 17 wherein the second ESD protection circuit further comprises:

a fourth diode coupled to the first pad and to a second conductor; and a second clamp circuit coupled between the second conductor and the second ground.

19. The apparatus as recited in claim 17 further comprising a second clamp circuit coupled between the first pad and the second ground.

20. An integrated circuit comprising:

a circuit block configured to communicate on a first pin of the integrated circuit, the circuit block comprising a first electrostatic discharge (ESD) protection circuit coupled between the first pin and a first ground of the integrated circuit and configured to provide ESD protection for a charged device model (CMD) ESD event on the first pin, and wherein the first ESD protection circuit is configured to discharge the static charge from a first area of the IC that is covered by the circuit block;

a second circuit coupled to the circuit block and configured to interface to the circuit block, wherein the second circuit includes a second ground, and wherein the second circuit includes a second ESD protection circuit coupled between the first pin and the second ground and configured to provide ESD protection for the CDM ESD event on the first pin, wherein the second ESD protection circuit is configured to discharge the static charge from a second area of the IC that is covered by a remainder of the IC;

a pair of cross-coupled diodes connected between the first ground and the second ground; and an interface circuit between the circuit block and the second circuit, the interface circuit powered by a power supply of the circuit block and grounded by the second ground.

* * * * *